(12) United States Patent
Rathore et al.

(10) Patent No.: US 11,199,028 B2
(45) Date of Patent: Dec. 14, 2021

(54) UTILITY METER ENCLOSURE WITH DUAL POSITION LOCKS

(71) Applicant: Landis+Gyr Innovations, Inc., Alpharetta, GA (US)

(72) Inventors: Bahadur Singh Rathore, Noida (IN); Nikhil Tanwani, Delhi (IN)

(73) Assignee: LANDIS+GYR INNOVATIONS, INC., Alpharetta, GA (US)

( * ) Notice: Subject to any disclaimer, the term of this patent is extended or adjusted under 35 U.S.C. 154(b) by 457 days.

(21) Appl. No.: 16/311,726

(22) PCT Filed: Jun. 23, 2016

(86) PCT No.: PCT/US2016/038973
§ 371 (c)(1),
(2) Date: Dec. 20, 2018

(87) PCT Pub. No.: WO2017/222530
PCT Pub. Date: Dec. 28, 2017

(65) Prior Publication Data
US 2019/0194976 A1    Jun. 27, 2019

(51) Int. Cl.
*F16M 13/00* (2006.01)
*E05B 65/00* (2006.01)
*H05K 5/02* (2006.01)

(52) U.S. Cl.
CPC ....... *E05B 65/0089* (2013.01); *H05K 5/0208* (2013.01)

(58) Field of Classification Search
CPC ... H05K 5/0208; E05B 65/0089; G01R 11/04; G01R 11/24
See application file for complete search history.

(56) References Cited

U.S. PATENT DOCUMENTS

| 4,749,359 | A | * | 6/1988 | White | H01R 13/44 174/60 |
| 4,872,847 | A | * | 10/1989 | Fennell | G01R 11/04 439/133 |
| 4,986,096 | A | | 1/1991 | Soehner et al. | |
| 5,870,911 | A | * | 2/1999 | DeWalch | G01R 11/24 70/159 |
| 5,979,691 | A | | 11/1999 | Von Holdt | |

(Continued)

FOREIGN PATENT DOCUMENTS

WO    2017222530    12/2017

OTHER PUBLICATIONS

Indian Patent Application No. 201817045864, First Examination Report dated Mar. 11, 2021, 6 pages.

(Continued)

*Primary Examiner* — Amy J. Sterling
(74) *Attorney, Agent, or Firm* — Kilpatrick Townsend & Stockton LLP

(57) ABSTRACT

A utility meter assembly having a base that is secured to a front cover. The assembly includes a dual locking system having a first locking position and a second locking position. In the first locking position, the front cover is removably secured with the base. In the second locking position, the front cover is permanently secured with the base to prevent separation of the two components unless one or both components are destroyed.

10 Claims, 12 Drawing Sheets

(56) References Cited

U.S. PATENT DOCUMENTS

| | | |
|---|---|---|
| 6,848,946 B2* | 2/2005 | Vicenza ............. B60R 16/0238 439/620.29 |
| 2006/0202489 A1 | 9/2006 | Collingham |
| 2007/0205012 A1* | 9/2007 | Stachowiak, Jr. ..... G01R 11/24 174/58 |
| 2009/0195974 A1* | 8/2009 | Rambosek ........... H05K 5/0278 361/679.32 |
| 2010/0043507 A1 | 2/2010 | Dreisbach et al. |
| 2010/0064625 A1 | 3/2010 | Charlton et al. |
| 2012/0268864 A1* | 10/2012 | Borowicz ............ H05K 5/0239 361/601 |
| 2016/0110567 A1* | 4/2016 | Rooyakkers .......... G06F 21/604 726/34 |
| 2017/0257958 A1* | 9/2017 | Sabbag .................... G10K 9/22 |
| 2019/0307000 A1* | 10/2019 | Sion ........................ G06F 1/182 |
| 2021/0100113 A1* | 4/2021 | Lamprecht ........... H05K 5/0221 |

OTHER PUBLICATIONS

International Application No. PCT/US2016/038973, "International Search Report and Written Opinion", dated Sep. 13, 2016, 9 pages.

* cited by examiner

UTILITY METER ENCLOSURE WITH DUAL POSITION LOCKS

BACKGROUND

The usage of resources such as gas, electricity and water are typically measured using meters. Utility meter enclosures typically include a front cover secured to a base. To prevent unauthorized access to and/or tampering with the meter, the front cover is secured to the base with a locking mechanism. However, current lock designs pose a risk of inadvertently and prematurely locking the front cover to the base during production. Welding is another option for securing the front cover to the base, but one that increases costs and overhead and can lead to reduced quality and environmental concerns.

SUMMARY

The term embodiment and like terms are intended to refer broadly to all of the subject matter of this disclosure. Statements containing these terms should be understood not to limit the subject matter described herein. This summary is a high-level overview of various aspects of the disclosure and introduces some of the concepts that are further described in the Detailed Description section below. This summary is not intended to identify key or essential features, nor is it intended to be used in isolation.

Disclosed is a utility meter enclosure having dual position locks. Specifically, the enclosure includes a plurality of locks that are each received in one of a plurality of receptacles in a first locking position and a second locking position. When in the first locking position, the front cover of the enclosure is temporarily secured with the base such that the front cover will not inadvertently separate from the base, but can still be adjusted if desired or required during manufacture or assembly. When in the second locking position, the front cover is permanently fixed with the base such that the enclosure cannot be opened without breaking one or both of the front cover and the base. The enclosure is locked in the second locking position at the end of the manufacturing and assembly process, after the need for any adjustments.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
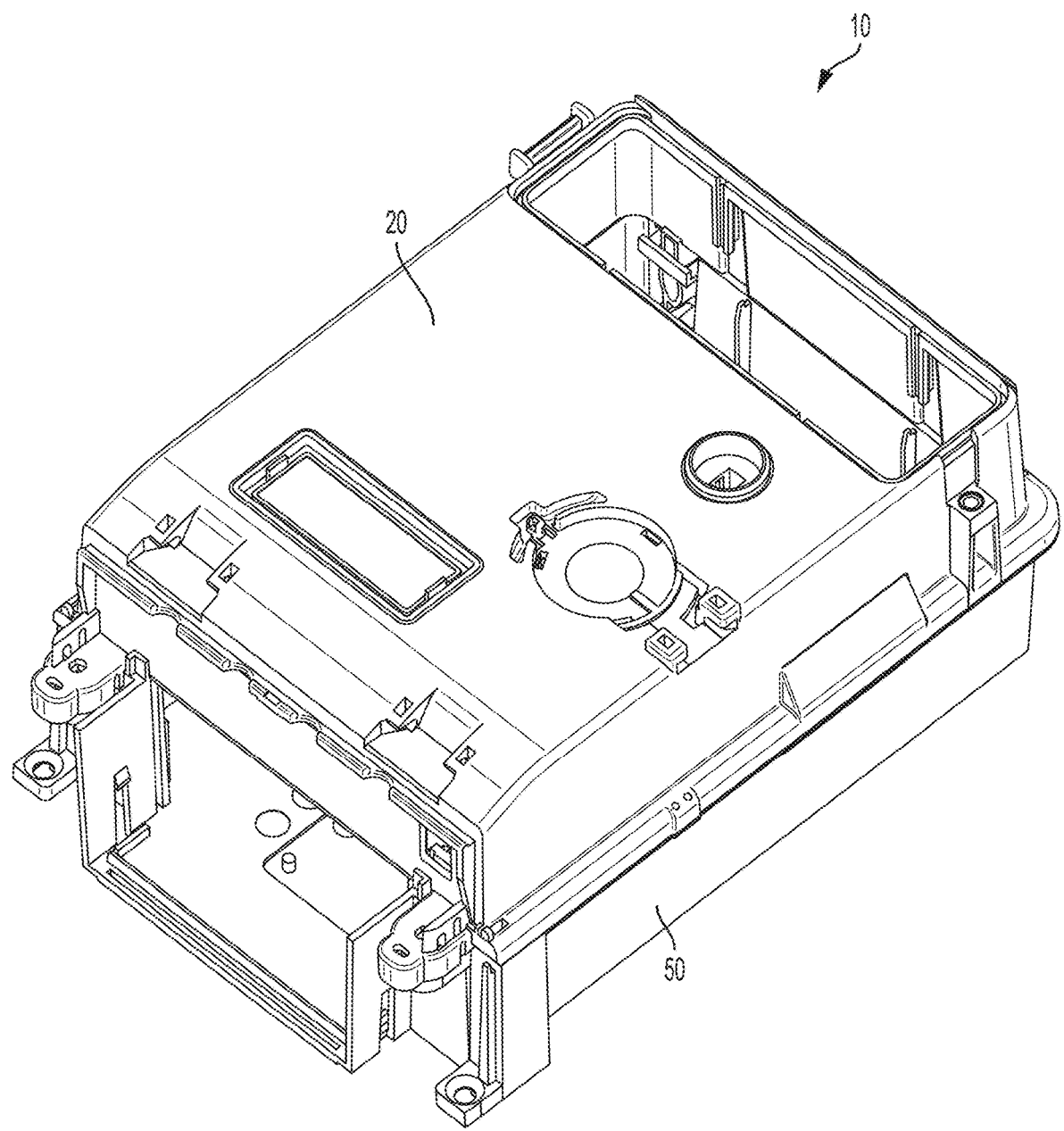
FIG. 1 is a perspective front view of a utility meter enclosure according to an example.
Figure 2:
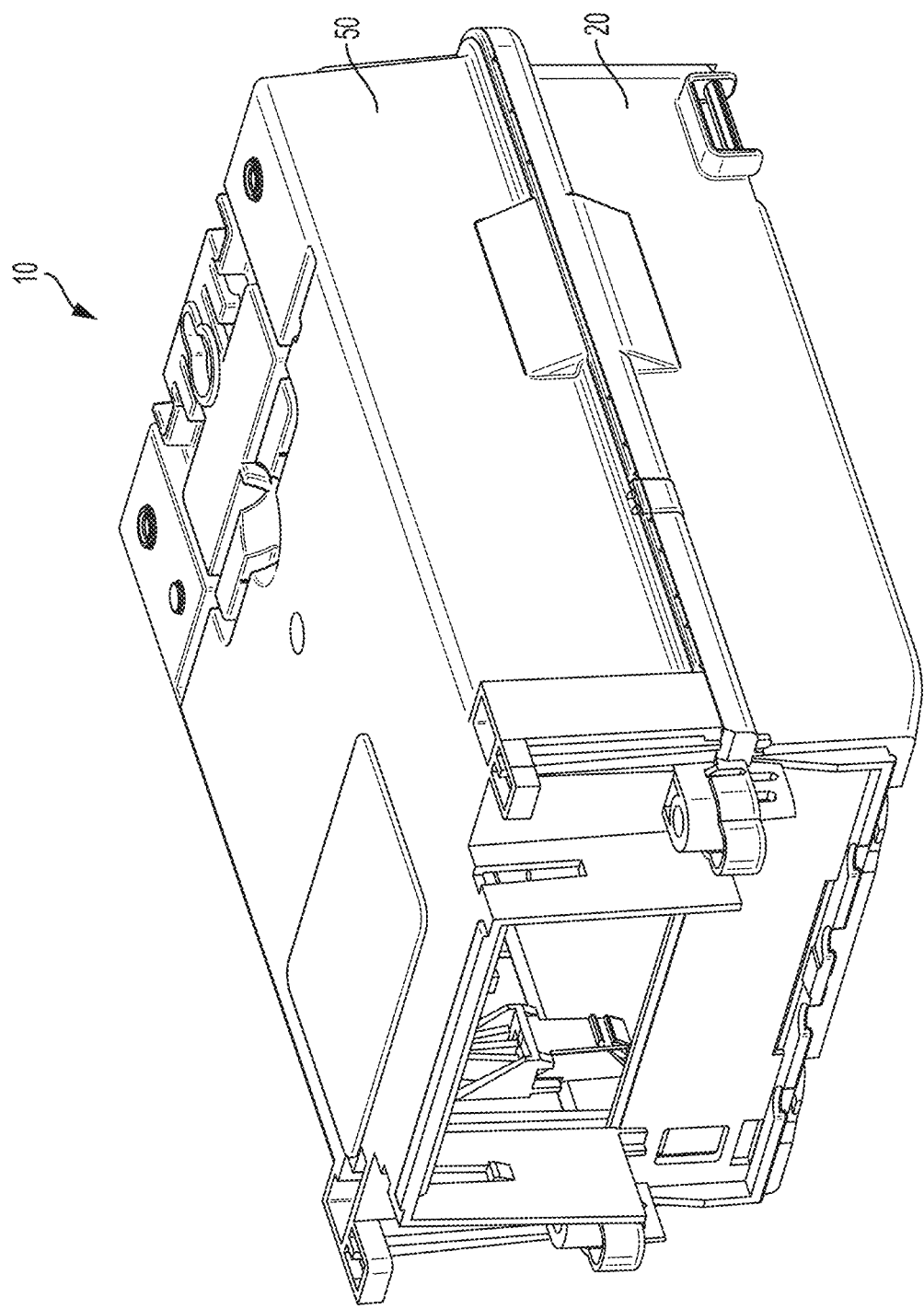
FIG. 2 is a perspective rear view of the utility meter enclosure of FIG. 1.
Figure 3:
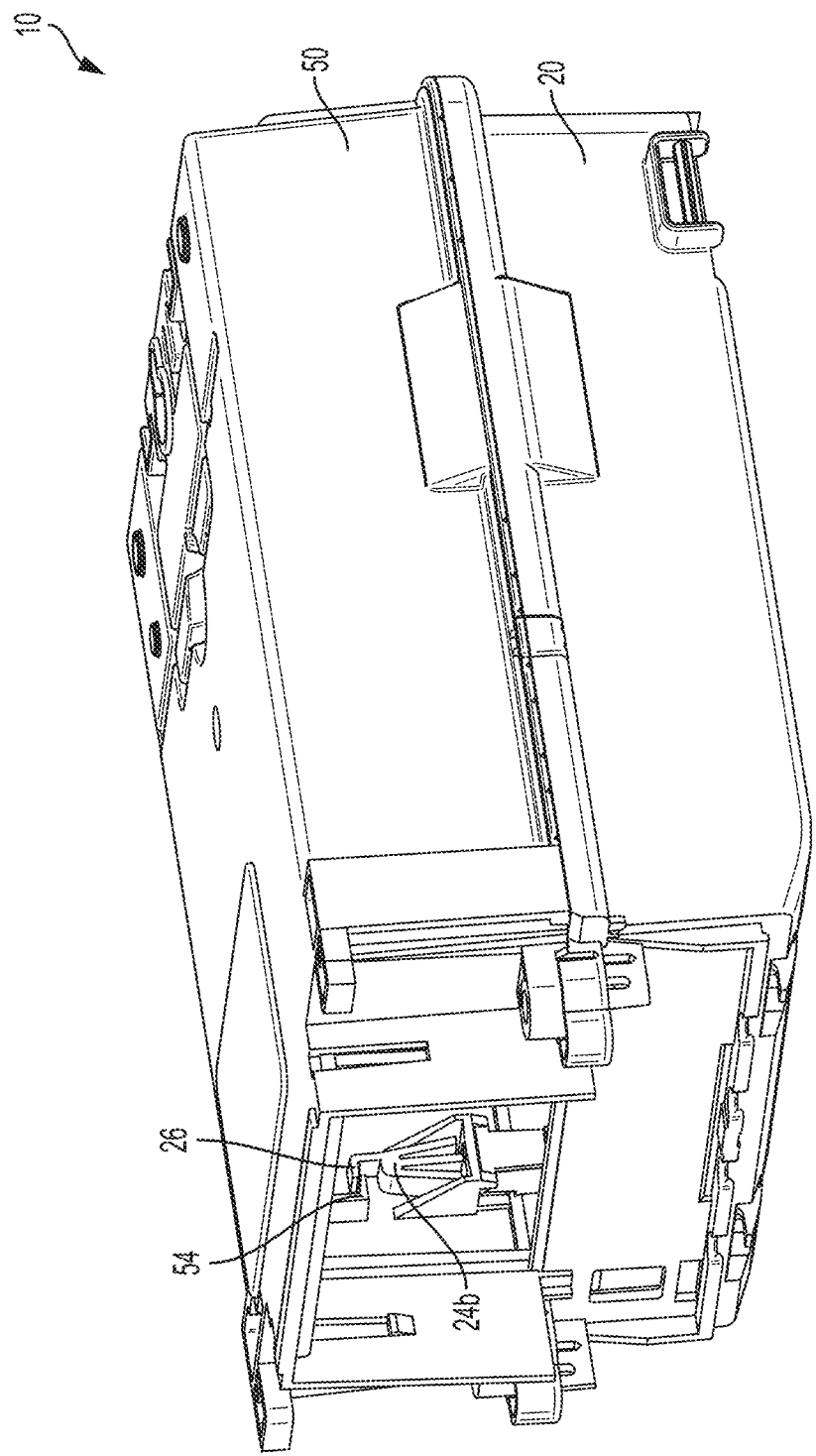
FIG. 3 is another perspective rear view of the utility meter enclosure of FIG. 1.
Figure 4:
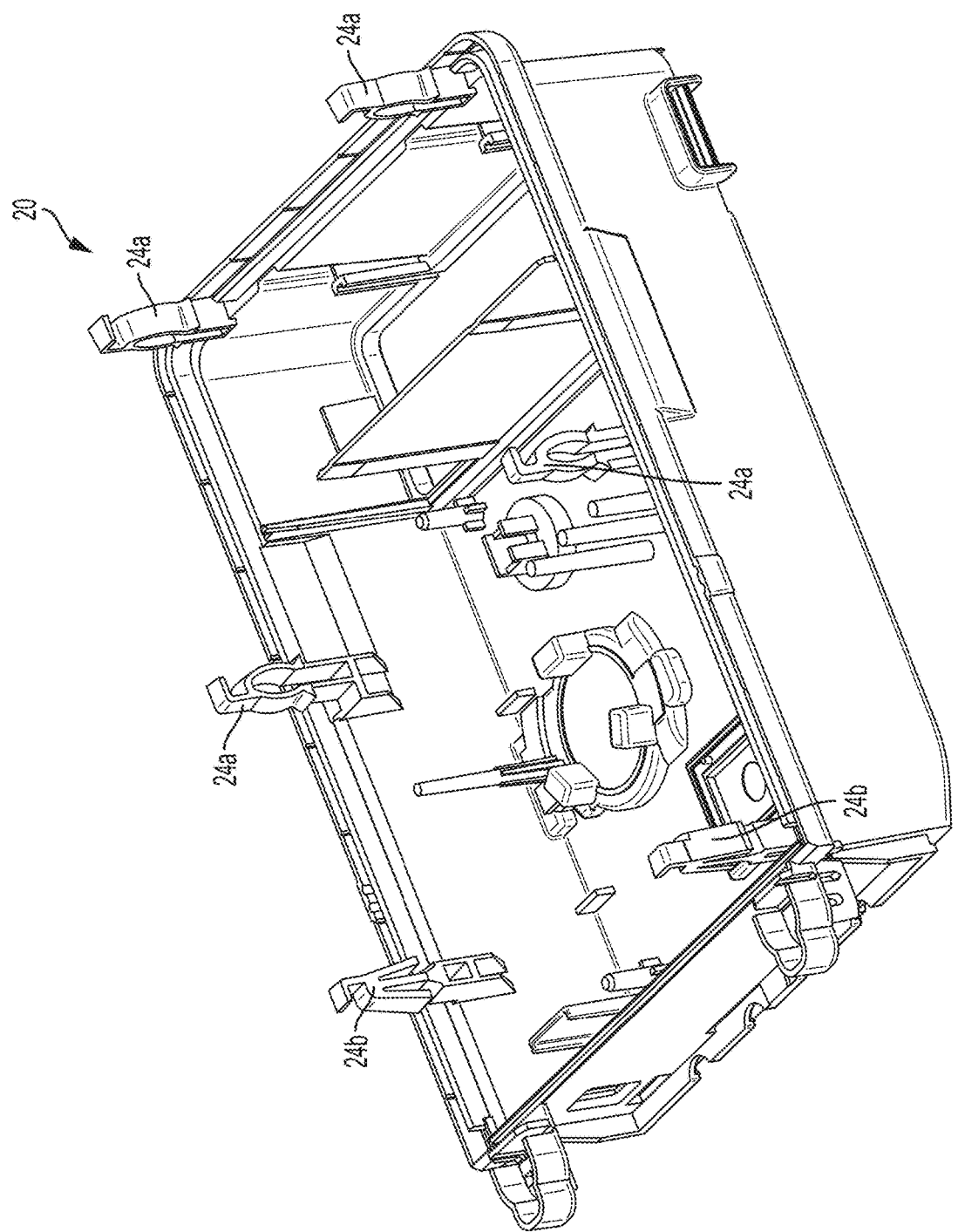
FIG. 4 is a perspective view of the front cover of the utility meter enclosure of FIG. 1.
Figure 5:
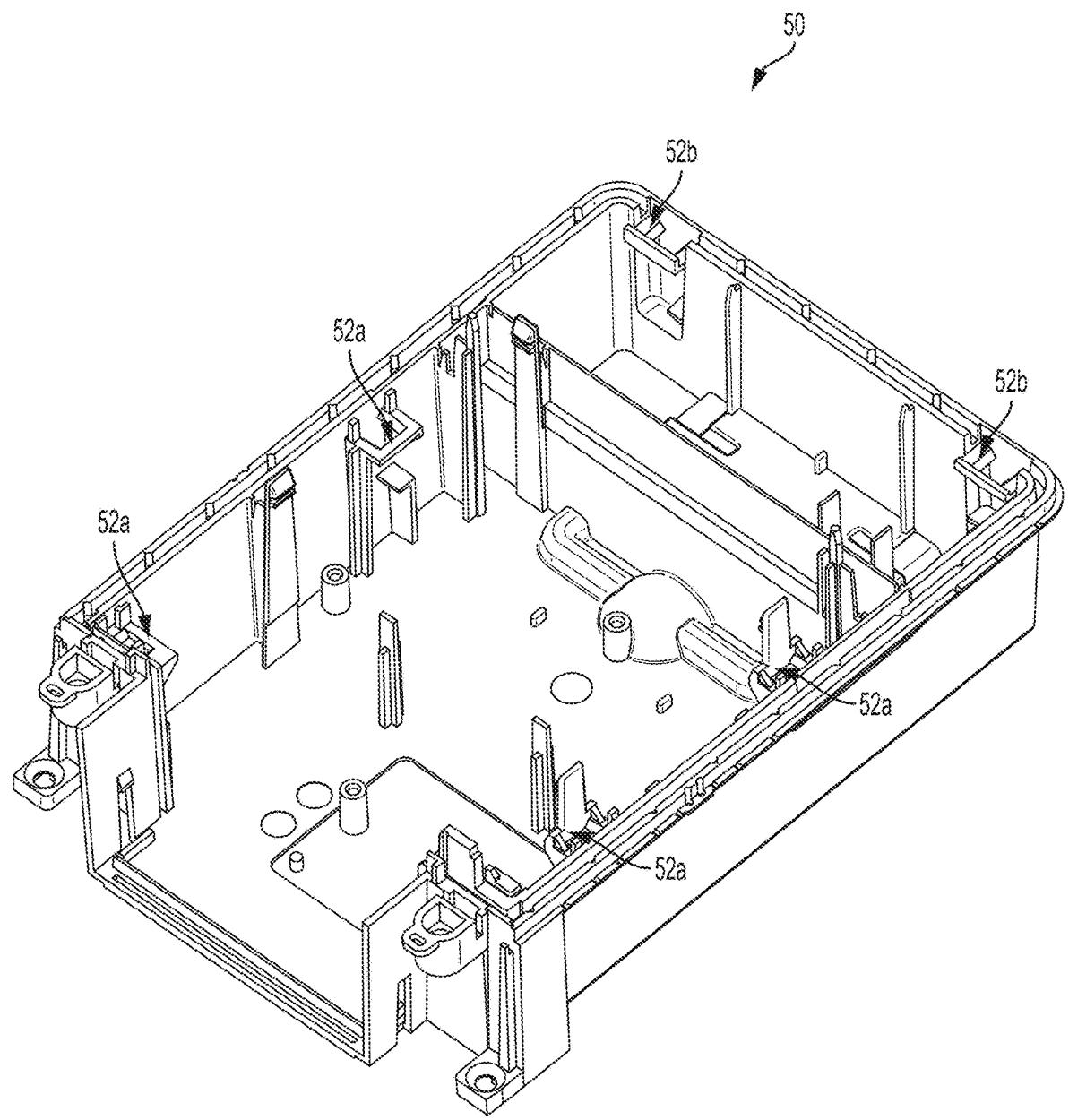
FIG. 5 is a perspective view of the base of the utility meter enclosure of FIG. 1.
Figure 6:
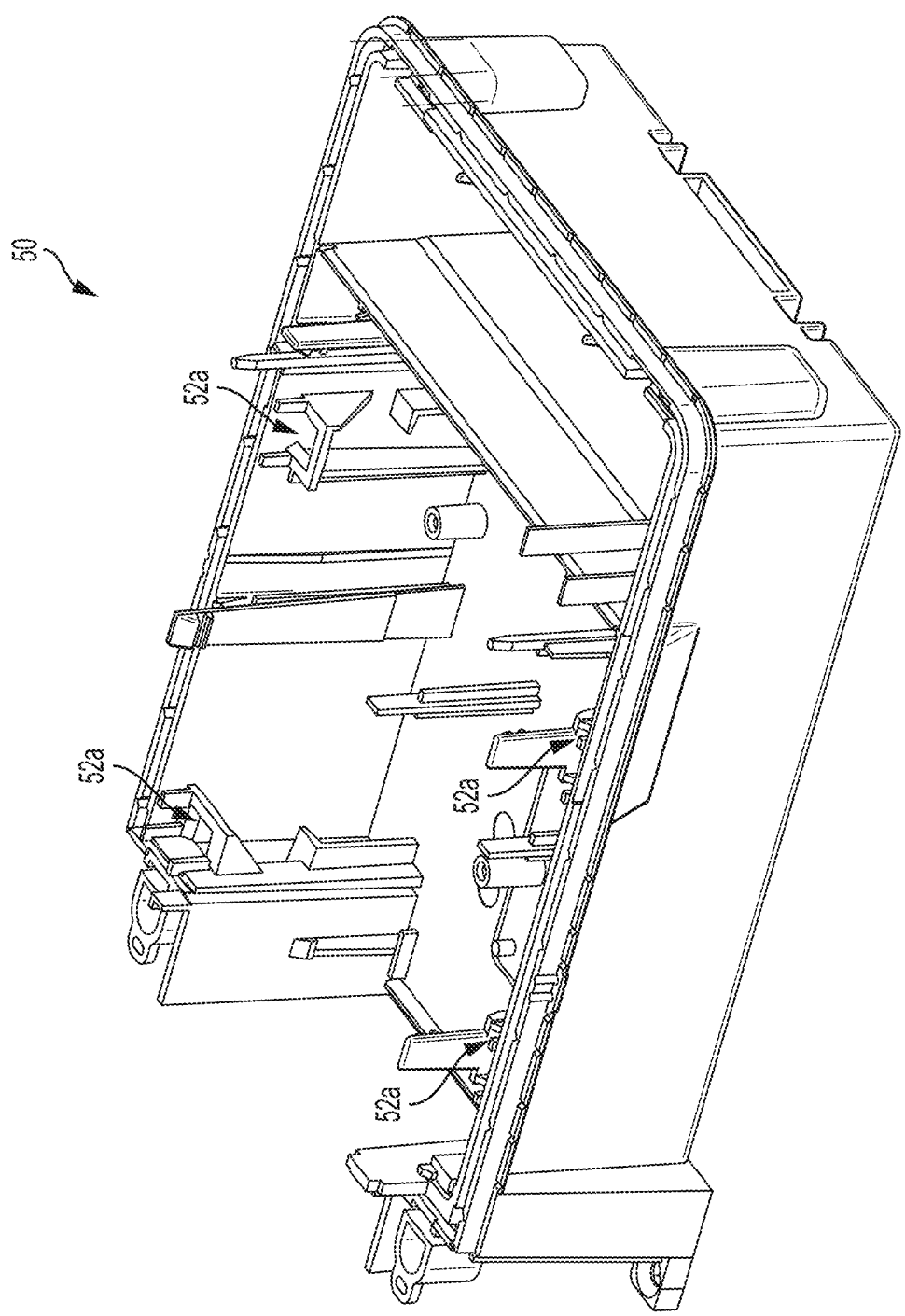
FIG. 6 is another perspective view of the base of the utility meter enclosure of FIG. 1.
Figure 7:
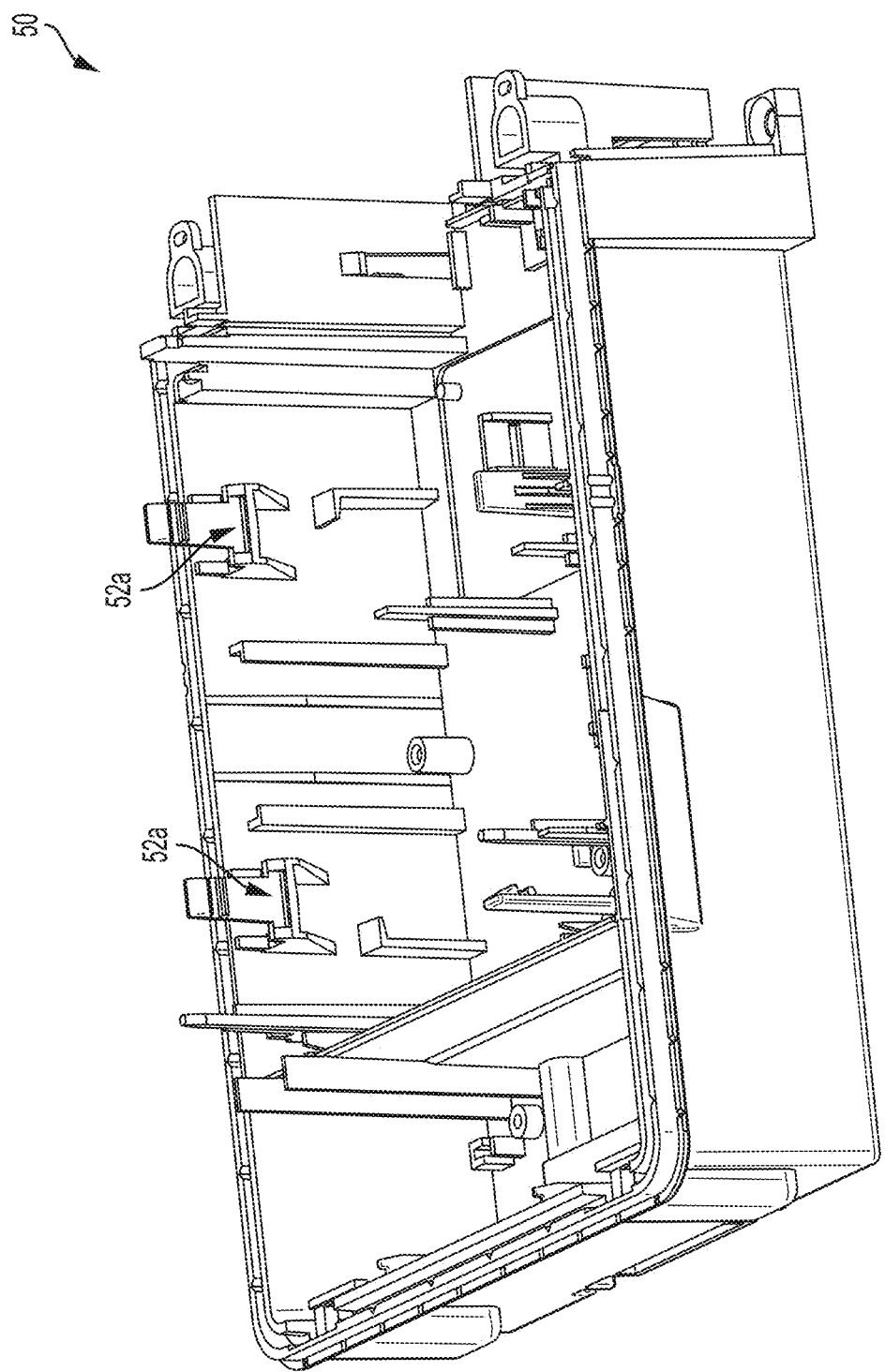
FIG. 7 is another perspective view of the base of the utility meter enclosure of FIG. 1.
Figure 8:
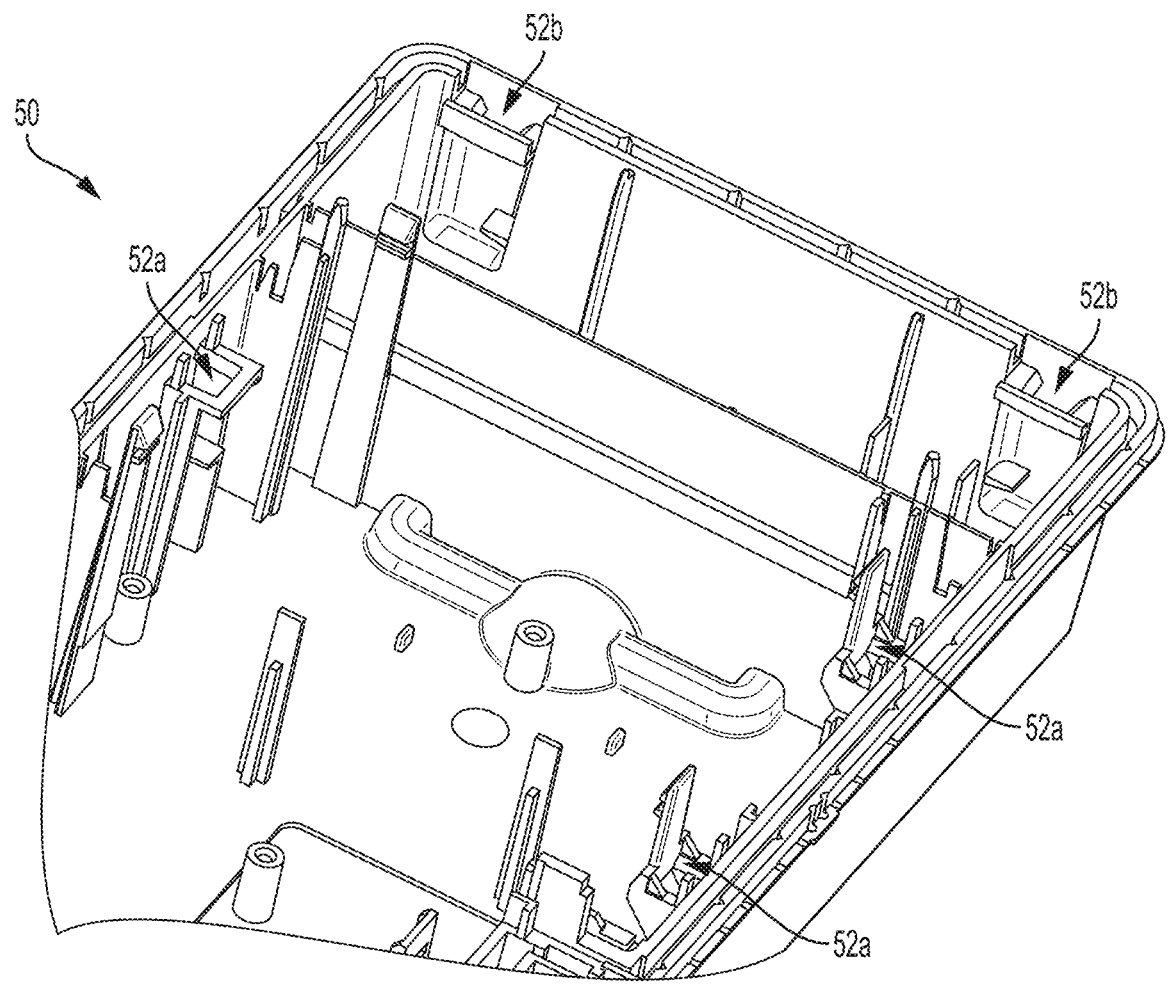
FIG. 8 is another partial perspective view of the base of the utility meter enclosure of FIG. 1.

FIGS. 1-15 illustrate different views of various components of a utility meter enclosure 10. The enclosure 10 includes a front cover 20 (FIGS. 1-4) and a base 50 (FIGS. 1-3 and 5-8) that snap fit or otherwise mate together (see, e.g., FIGS. 1-3).

The enclosure 10 includes a plurality of locks 24*a*, 24*b* each configured to be received in one of a plurality of receptacles 52*a*, 52*b*. Each lock 24*a*, 24*b* has two locking positions, as explained in more detail below. Although the illustrated enclosure includes six locks 24*a*, 24*b* and six receptacles 52*a*, 52*b*, any suitable number of locks and receptacles may be used.

In the illustrated enclosure, the locks 24*a*, 24*b* are positioned around the perimeter of the front cover 20 and the receptacles 52*a*, 52*b* are positioned around the perimeter of the base 50. However, the locks 24*a*, 24*b* may be positioned on the base 50 and the receptacles 52*a*, 52*b* may be positioned on the front cover 20, or any suitable combination thereof.

Similarly, although the illustrated example includes locks having two configurations, 24*a*, 24*b* (explained in more detail below), the locks may have alternate configurations. The illustrated enclosure 10 includes four locks 24*a* and two locks 24*b*, although any suitable combination may be used, including an arrangement having only locks 24*a* or only locks 24*b* or other combinations or locks of other configurations.

Base 50 includes four receptacles 52*a* and two receptacles 52*b* (see FIG. 8) that are recessed into an end wall of the base 50. Each of the receptacles 52*a*, 52*b* is configured to receive one of the locks 24*a*, 24*b* to secure the front cover 20 with the base 50.

Figure 9:
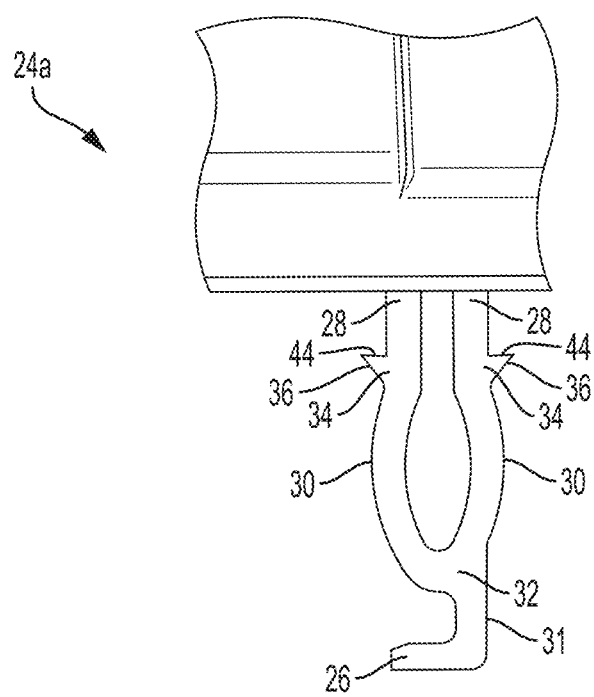
FIG. 9 is a close-up view of one of the locks of the front cover of FIG. 1.

Lock 24*a* is shown in more detail in FIG. 9. Lock 24*a* is formed of an elastically deformable material such as plastic. Lock 24*a* includes two legs 28 that connect at a distal portion 32. Because they are formed of an elastically deformable material, the legs 28 can be compressed toward one another into a compressed position but return to their original position once released. Extending distally from the distal portion 32 is a neck 31 and a resting feature 26, explained in more detail below. Each of legs 28 includes a projection 34 near a proximal end of the lock. Each projection 34 has a planar surface 44 and an angled surface 36. As explained in more detail below, the projections 34 are configured to retain the lock 24*a* in a second locking position. Between the projections 34 and the distal portion 32, the legs each have a curved profile 30. The curved profiles 30 are configured to retain the lock 24a in a first locking position.

Figure 10:
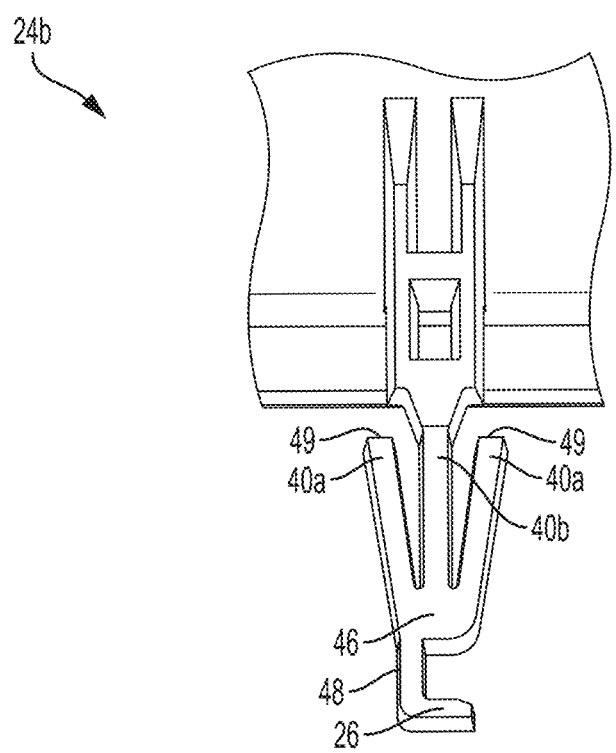
FIG. 10 is a close-up view of another of the locks of the front cover of FIG. 1.
Figure 11:
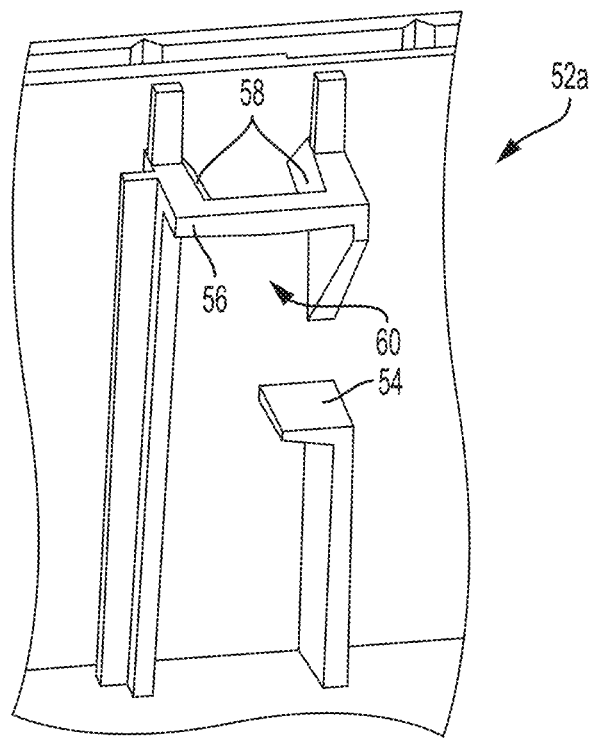
FIG. 11 is a close-up view of one of the receptacles of the base of FIG. 1.

Lock 24b is shown in more detail in FIG. 10. Lock 24b includes three straight or generally straight legs 40 that join together at a distal portion 46. The two outer legs 40a are angled relative to the middle leg 40b. Extending distally from the distal portion 46 is a neck 48 and a resting feature 26, explained in more detail below. In some cases, the lock 24b is configured so that any attempts to tamper with the enclosure 10 are more evident. In some cases, lock 24b is more flexible than lock 24a due to the configuration of its legs as compared with the rigidity imparted by the angled surfaces 36 and the curved profiles 30 of the lock 24a.

Figure 12:
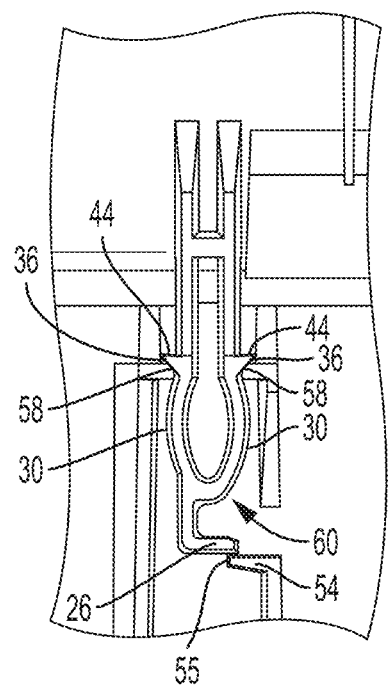
FIG. 12 is a schematic cross sectional view illustrating engagement of the lock of FIG. 9 with the receptacle of FIG. 11 in a first locked position.
Figure 13:
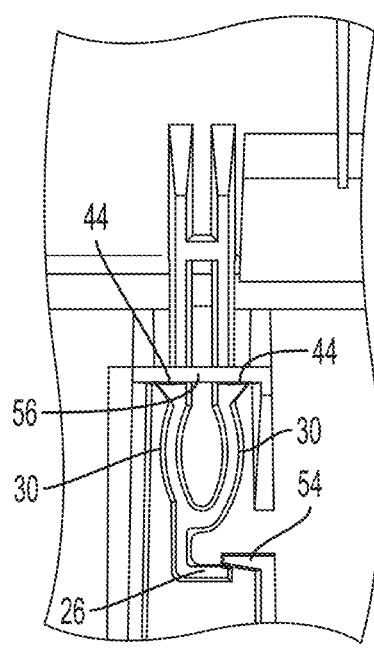
FIG. 13 is a schematic illustrating engagement of the lock of FIG. 9 with the receptacle of FIG. 11 in a second locked position.

As illustrated in FIGS. 12-13, each of the locks 24a is configured to be received in one of the receptacles 52a, 52b in two locking positions. FIG. 12 illustrates the engagement of a lock 24a with a receptacle 52a in the first locking position while FIG. 13 illustrates the engagement of the lock 24a with the receptacle 52a in the second locking position. In the first locking position, the front cover 20 is temporarily secured with the base 50, and can be opened if needed. In the second locking position, the front cover 20 is permanently secured with the base 50 and can only be released by breaking the front cover 20 and/or the base 50.

In the first locking position shown in FIG. 12, the lock 24a is partially inserted into the open area 60 of the receptacle 52a. Specifically, since lock 24a is made of an elastically deformable material, the curved profiles 30 of the lock 24a are able to compress toward one another to permit the lock 24a to pass through the gap between tapered sides 58 of receptacle 52a. As illustrated in FIG. 12, the angled surfaces 36 of the projections 34 of the lock 24a abut the tapered sides 58 to retain the curved profiles 30 in a partially compressed state. Even in the partially compressed state, as shown in FIG. 12, the width between the curved profiles 30 of the legs 28 is greater than the width of the gap between the tapered sides 58 of the receptacle 52a. In this manner, the curved profile 30 of the legs 28 prevents the lock 24a from inadvertently backing out of the receptacle 52a and helps retain the lock 24a in the first locked position.

Moreover, the bottom surface of the resting feature 26 of the lock 24a rests along the top surface of the resting ledge 54 of the receptacle 52a to prevent the lock 24a from inadvertently and prematurely moving into the second locking position. In some cases, the overlap between the resting feature 26 and the resting ledge 54 is configured so that, once the lock 24a is in the first locking position, the lock 24a only moves to the second locking position upon the application of a sufficient, predetermined force. In some examples, the end point 55 of the resting ledge 54 is positioned between the tapered sides 58 of the receptacle 52a. In one non-limiting example, the overlap between the resting feature 26 and the resting ledge 54 is approximately 1 mm. In some cases, the overlap between the resting feature 26 and the resting ledge 54 along with the configuration of the angled surfaces 36 help retain the lock 24a in the first locking position.

The lock 24a can be released from the first locking position—for instance if the front cover 20 needs to be adjusted during the manufacturing process—by pulling the lock 24a away from the open area 60 to separate the resting feature 26 of the lock 24a from the resting ledge 54 of the receptacle 52a.

Upon the application the predetermined force, the resting feature 26 moves past the resting ledge 54 and the angled surfaces 36 of the projections 34 of the lock 24a slide along the tapered sides 58 so the lock 24a moves further within the open area 60 of the receptacle 52a. This moves the lock 24a from the first locking position toward the second locking position. Once the angled surfaces 36 have cleared the tapered sides 58, the projections 34 snap apart as the legs 28 expand back to their original position and the planar surfaces 44 of the projections 34 abut the ledge 56 of the receptacle 52a. The abutment of the planar surfaces 44 of the projections 34 with the ledge 56 prevents the lock 24a from backing out of the receptacle 52a. The lock 24a is now in the second locking position and the front cover 20 cannot be separated from the base 50 without breaking one or both of the front cover 20 and the base 50. In the second locking position, the upper surface of the resting feature 26 abuts the lower surface of the resting ledge 54.

Figure 14:
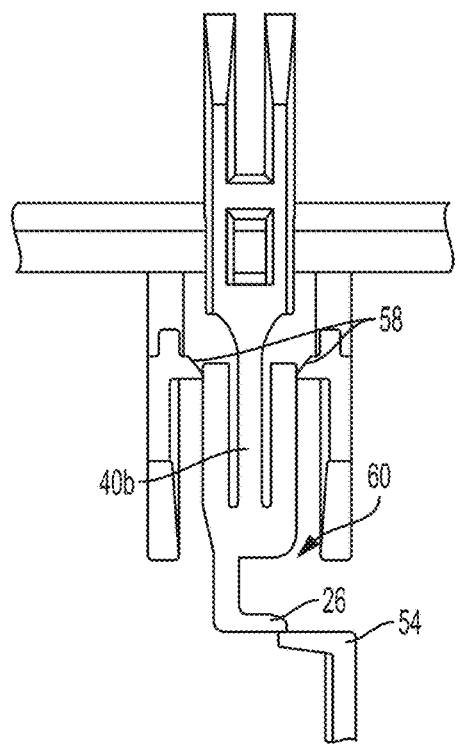
FIG. 14 is a schematic cross sectional view illustrating engagement of the lock of FIG. 10 with the receptacle of FIG. 11 in a first locked position.
Figure 15:
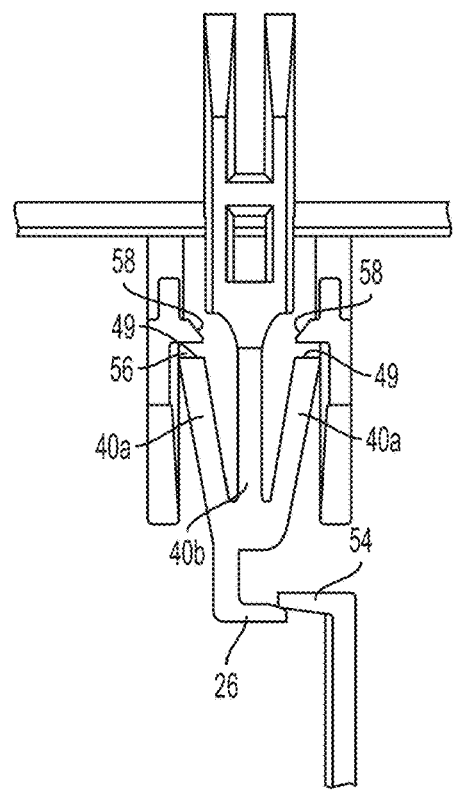
FIG. 15 is a schematic cross sectional view illustrating engagement of the lock of FIG. 10 with the receptacle of FIG. 11 in a second locked position.

As illustrated in FIGS. 14-15, each of the locks 24b is also configured to be received in one of the receptacles 52a, 52b. FIG. 13 illustrates the engagement of a lock 24b with a receptacle 52a in a first locking position, while FIG. 15 illustrates the engagement of the lock 24b with the receptacle 52a in the second locking position. In the first locking position shown in FIG. 14, the lock 24b is partially inserted into the open area 60 of the receptacle 52a. As with the lock 24a, the bottom surface of the resting feature 26 of the lock 24b rests along the top surface of the resting ledge 54 of the receptacle 52a to help prevent the lock 24a from inadvertently and prematurely moving into the second locking position. In some cases, the locks 24a predominately serve to retain the enclosure 10 in the first locking position, as the configuration of the legs of the lock 24b can be such that they do not help prevent the lock 24b from inadvertently backing out of the receptacle 52a.

Upon the application of the sufficient force, the resting feature 26 moves past the resting ledge 54 so the lock 24b moves further within the open area 60 of the receptacle 52a. This moves the lock 24b from the first locking position toward the second locking position. The abutment of the planar surfaces 49 of the legs 40a with the ledge 56 prevents the lock 24b from backing out of the receptacle 52a. The lock 24b is now in the second locking position and the front cover 20 cannot be separated from the base 50 without breaking one or both of the front cover 20 and the base 50. In the second locking position, the upper surface of the resting feature 26 abuts the lower surface of the resting ledge 54.

Numerous modifications of this invention may be made in the composition, application, manufacturing process and other aspects of this invention without departing from the objectives and spirit of the description above and in the Figures.

The invention claimed is:

1. A utility meter enclosure comprising:
   a front cover;
   a base;
   a plurality of locks positioned on one of the front cover and the base, wherein each of the plurality of locks comprises a resting feature; and
   a plurality of receptacles positioned on the other of the front cover and the base, wherein each of the plurality of receptacles comprises a resting ledge, wherein:
      each of the plurality of locks is receivable within one of the plurality of receptacles in (1) a first locking position in which the front cover is temporarily secured with the base and a lower surface of the resting feature abuts a top surface of the resting ledge and (2) a second locking position in which the front cover is permanently secured with the base; and the utility meter enclosure moves from the first locking position to the second locking position when the lower surface of the resting feature moves past the top surface of the resting ledge, wherein a top surface of the resting feature abuts a bottom surface of the resting ledge in the second locking position.

2. The utility meter enclosure of claim 1, wherein at least some of the plurality of locks are positioned along the front cover and at least some of the plurality of receptacles are positioned along the base.

3. The utility meter enclosure of claim 1, wherein at least some of the plurality of locks comprise two legs that are compressed by angled sides of one of the plurality of receptacles to retain the enclosure in the first locking position.

4. The utility meter enclosure of claim 3, wherein the legs are made of an elastically deformable material.

5. The utility meter enclosure of claim 3, wherein at least a portion of each of the two legs includes a curved profile.

6. The utility meter enclosure of claim 1, wherein at least some of the plurality of locks comprise two projections each with a planar surface that, when in the second locking position, abut a bottom surface of a ledge of one of the plurality of receptacles to permanently retain the enclosure in the second locking position.

7. The utility meter enclosure of claim 6, wherein the two projections each comprises an angled surface adjacent the planar surface.

8. The utility meter enclosure of claim 7, wherein each of the angled surfaces slides along an angled side of one of the plurality of receptacles as the utility meter enclosure moves from the first locking position into the second locking position.

9. The utility meter enclosure of claim 3, wherein the two legs of each of the at least some of the plurality of locks join together at a distal end of the lock.

10. The utility meter enclosure of claim 1, further comprising a second set of locks, wherein each of the second set of locks comprises two outer legs and an inner leg, each of the two outer legs and the inner leg being generally straight and each of the two outer legs being angled relative to the middle leg.

* * * * *